United States Patent [19]
Davis et al.

[11] Patent Number: 5,208,068
[45] Date of Patent: May 4, 1993

[54] LAMINATION METHOD FOR COATING THE SIDEWALL OR FILLING A CAVITY IN A SUBSTRATE

[75] Inventors: Charles R. Davis, Johnson City; Ronald D. Goldblatt, Rye Brook, both of N.Y.

[73] Assignee: International Business Machines Corporation, Armonk, N.Y.

[21] Appl. No.: 626,327

[22] Filed: Dec. 13, 1990

Related U.S. Application Data

[63] Continuation of Ser. No. 339,557, Apr. 17, 1989, abandoned.

[51] Int. Cl.⁵ .............................................. C23C 26/00
[52] U.S. Cl. ....................................... 427/97; 427/98
[58] Field of Search .............................. 427/98, 97, 96

[56] References Cited

U.S. PATENT DOCUMENTS

| | | | |
|---|---|---|---|
| 3,727,108 | 4/1973 | Westrom | 317/68 |
| 4,001,651 | 1/1977 | Kershaw, Jr. | 317/61 |
| 4,145,460 | 3/1979 | Finley | 427/97 |
| 4,161,012 | 7/1979 | Cunningham | 361/128 |
| 4,188,415 | 2/1980 | Takahashi | 427/97 |
| 4,240,124 | 12/1980 | Westrom | 361/127 |
| 4,336,100 | 6/1982 | Passlick | 156/630 |
| 4,404,614 | 9/1983 | Koch et al. | 361/128 |
| 4,572,764 | 2/1986 | Fan | 427/98 |
| 4,651,417 | 3/1987 | Schumacher | 427/97 |
| 4,656,555 | 4/1987 | Raudabaugh | 361/117 |
| 4,791,248 | 12/1988 | Oldenettel | 427/97 |

FOREIGN PATENT DOCUMENTS

| | | |
|---|---|---|
| 2739494 | 3/1979 | Fed. Rep. of Germany . |
| 3027336 | 2/1982 | Fed. Rep. of Germany . |
| 0035163 | 4/1978 | Japan ............ 427/97 |
| 0025998 | 6/1982 | Japan ............ 427/97 |

OTHER PUBLICATIONS

Ohio Brass Catalog 94: PDV-65 and PDV-100 Distribution Class Surge Arresters.
Joslyn Manufacturing Co. Publication: ZQP Arresters . . . The Latest in Metal Oxide Polymeric Technologies.
English Translation of German Patent 3027336.

*Primary Examiner*—Michael Lusigan
*Assistant Examiner*—Vi Duong Dang
*Attorney, Agent, or Firm*—Daniel P. Morris

[57] ABSTRACT

Method for pressing a material into a through-hole or blind-hole in a substrate. The material is disposed on the surface of the substrate. An environment is provided permitting the material to flow for example by heating the material to the glass transition temperature or above. Thereafter pressure is applied causing the material to flow, first coating the sidewall of the hole and on the continued application of pressure the material flows to completely fill the hole. The resulting substrate can have a substantially planar surface having holes with the periphery coated with or completely filled with the material. The material is preferably a thermoplastic polymeric material such as a polyimide and a perfluorinated polymer.

29 Claims, 6 Drawing Sheets

LAMINATION METHOD FOR COATING THE SIDEWALL OR FILLING A CAVITY IN A SUBSTRATE

This is a continuation of application Ser. No. 07/339,557, filed Apr. 17, 1989, now abandoned.

FIELD OF INVENTION

This invention relates to a method for providing a coating on the sidewall of a cavity in a substrate, more particularly to a method for filling the cavity in the substrate, by providing a substrate with cavities therein and a material thereon and providing an environment permitting the material to flow and pressing the material into the cavity.

BACKGROUND OF INVENTION

Substrates on which an electronic device are electrically mounted are commonly fabricated from dielectric materials such as ceramics, ceramic metal composites, polymeric materials and polymeric material metal composites. These substrates can have multi-level electrical conductor patterns imbedded therein.

In a simplest embodiments the substrate has one dielectric layer having electrical conductor patterns on both sides thereof which are electrically interconnected by a plurality of electrically conducting vias extending through the substrate.

In another embodiment, the substrate is fabricated from an electrically and/or thermally conducting layer coated with a dielectric material. A plurality of through-holes are drilled, punch or etched through the substrate. To form an electrically conducting via which is electrically insulated from the core requires that the through-hole sidewall be coated at least in the region of the core, with an electrically insulating material.

One method of coating the sidewall of the through-hole with a dielectric material is to dip the substrate into a liquid polymer. For the liquid polymer to get into the through-hole requires that the liquid polymer have a sufficiently low viscosity. Generally, to achieve such a low viscosity requires that the liquid polymer be mixed with a solvent. If it is desired that only the sidewall of the through-hole be coated with the dielectric material, the liquid polymer must have a high solvent content. Moreover, to promote wetting of the sidewall by the dielectric coating requires that the liquid polymer have a high solvent content. The substrate must then be cured or heated to volatize the solvent contained in the liquid polymer. Where the liquid polymer has a high solvent content, securing of the liquid polymer results in a substantial shrinkage of the thickness of the liquid polymer layer coating the through-hole sidewall. Generally, to achieve a polymeric sidewall thickness which is sufficiently thick to reliably avoid electric shorting between the core and the electrically conductive via which will be deposited in the sidewall coated through-hole, requires multiple immersions in the liquid polymer and multiple curing steps of build up the sidewall thickness.

A method according to present invention avoids the use of liquid polymers containing solvents to coat the sidewalls of through-holes and also avoids the multiple step process to achieve adequate sidewall dielectric thickness.

Another method of coating the sidewall of a through-hole in a substrate containing an electrically conducting core is electrophoretic deposition. In electrophoretic deposition the substrate with through-holes therein is immersed in a solution containing polymer particles. An electrode is immersed in the solution and a potential is applied between this electrode and the electrically conductive core of the substrate. Particles in the solution enter into the through-holes and there is an electronic exchange at the exposed electrically conductive core in the sidewall of the through-hole which results in the deposition of the polymeric material thereon. This results in a relatively high current at the electrically conductive core part of the sidewall of the through hole. If this current is too high there is a rapid generation of gas which prevents effective electrophoretic deposition. If the current is too low there is no electrophoretic deposition. Therefore, electrophoretic deposition requires precise control of the current to effectively deposit the polymeric sidewall.

According to the present invention the disadvantages of the above described techniques are avoided. According to one aspect of the present invention, the dielectric material is heated and then pressed. Quite surprisingly it has been found that the dielectric material which gets pressed into the through-holes can be controlled to coat only the sidewall of the through-hole or to completely fill the through-hole without trapping therein voids which would result in defects in the dielectric material either coating the sidewall of the through-hole or completely filling it.

Quite surprisingly it has been found that a relatively large number of through-holes on a relatively large substrate can be coated with a dielectric material by the method according to the present invention. Where a through-hole has been completely filled by the method according to the present invention a through-hole through the enter of the dielectric material filling the substrate through-hole can be thereafter formed by drilling, punching or etching.

It is an object of this invention to either coat the sidewall of a hole in a substrate or to completely fill the hole in a substrate with a material by pressing the material without trapping voids in the dielectric material.

SUMMARY OF THE INVENTION

In its broadest aspect this invention is a method of coating the sidewall of a cavity or completely filling a cavity in a substrate with a material by providing an environment permitting the material to flow and pressing the material which results in the material coating the sidewall and thereafter building up in thickness over time until it fills the cavity.

In a more particular aspect of the present invention the material wets the substrate.

In another more particular aspect of the present invention, the material has a lower surface free energy than the surface free energy of the substrate.

In another more particular aspect of the present invention, heat is applied to provide the environment for the material to be above the glass transition temperature, and thereby susceptible to flow.

In another more particular aspect of the present invention, the thickness of the material coating on the substrate cavity sidewall is controlled by controlling the time of the duration of the application of the heat and pressure.

In another more particular aspect of the present invention, the substrate is an electrical and/or thermal conductor.

In another more particular aspect of the present invention, the cavity is a through-hole through the substrate.

In another more particular aspect of the present invention, the material has at most short range crystalline order.

In another more particular aspect of the present invention, the material is a thermoplastic polymeric material.

In another more particular aspect of the present invention, the polymeric material is a polyimide or fluorinated polymer.

These and other objects, features and advantages will be apparent from the following more particular description of the preferred embodiment.

BRIEF DESCRIPTION OF THE DRAWINGS

FIGS. 14, 15, 16 shows the result of applying pressure on structure of FIG. 13.

DETAILED DESCRIPTION OF THE PREFERRED EMBODIMENT

Figure 1:
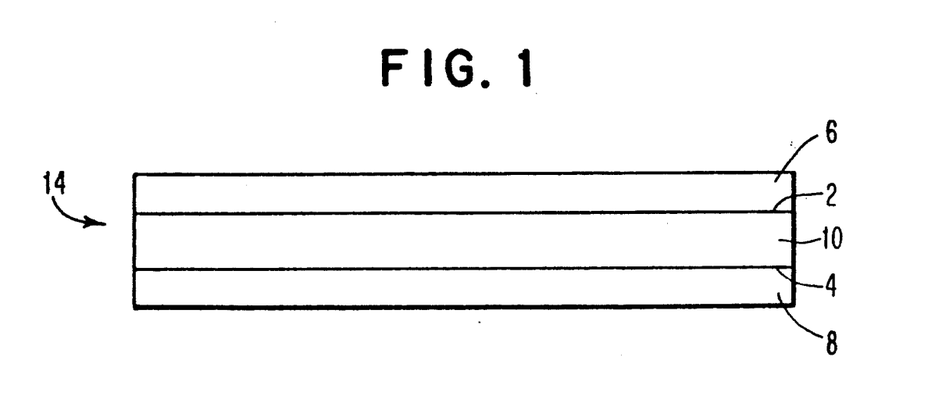
FIG. 1 diagrammatically shows a substrate having a top and bottom major surface with a material layer disposed thereon.

Referring to FIG. 1 surface 2 and surface 4 of substrate 10 are coated with material layer 6 and 8 respectively.

Figure 2:
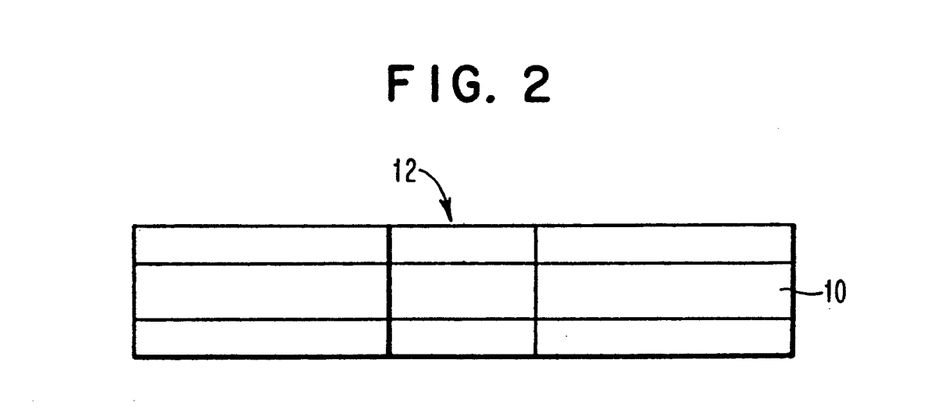
FIG. 2 diagrammatically shows a substrate of FIG. 1 with a through-hole formed therein.

As shown in FIG. 2 a through-hole 12 is formed in structure 14 of FIG. 1. The through-hole can be formed by any method commonly known in the art such as drilling, punching, laser ablation and etching. These methods are exemplary only and not limiting. When etching is used, a resist-like material is first deposited and selectively removed in the regions of the substrate which are exposed the substrate is etched away by methods commonly known in the art.

Figure 3:
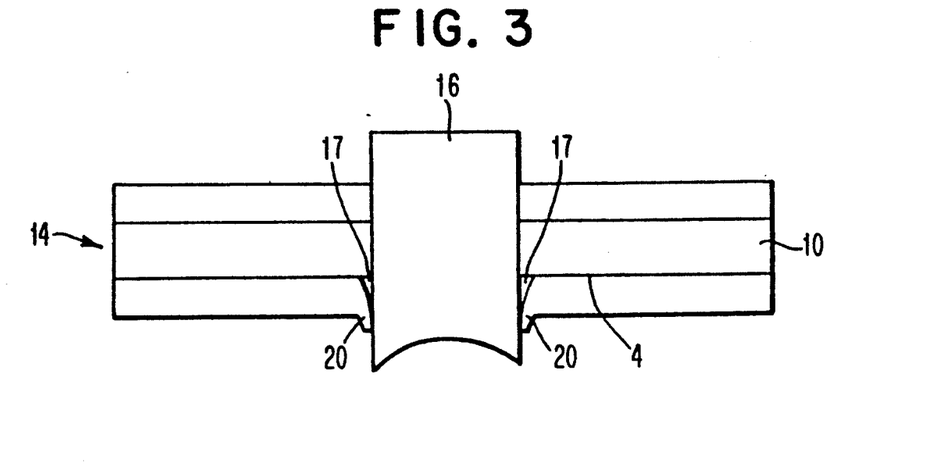
FIG. 3 diagrammatically shows a punch forming a through-hole in the structure of FIG. 1.

In FIG. 3 a punch 16 is shown inserted through substrate 14 to form through-hole 12 of FIG. 2. Typically when a through-hole is formed by punching or drilling material of layer 10, if it is soft or malleable is smeared out forming the extension regions 17 of surface 4 of layer 10 in the vicinity of the punch or drill bit 16.

Figure 4:
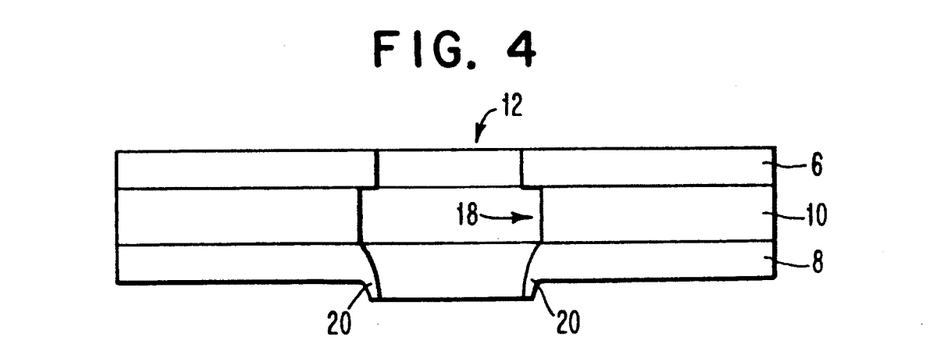
FIG. 4 diagrammatically shows the result of the punching operation shown in FIG. 3.

The smearing out of layer 10 generally causes layer 8 of structure 14 to have extensions 20. As shown in FIG. 4 material layer 10 along the sidewall 18 of through-hole 12 is etched back to eliminate the extensions 17. This step has been found to be required only if the extensions 17 are too large to permit the materials of layer 6 and layer 8 from being pressed into through-hole 12. Extensions 17 and 20 are shown enlarged for clarity.

In the preferred embodiment, layer 10 is formed from an electrically and/or thermally conductive material, for example Cu, Al, Cu-Invar-Cu, Mo and alloys thereof and material.

In the preferred embodiment, the material 8 and 6 of FIG. 1 are dielectric materials more preferably polymeric materials. Thermoplastic polymeric materials have a characteristic glass transition temperature, $T_g$, above which they begin to flow. Polymeric materials and their glass transition temperatures, useful to practice the present invention are described in "Polymer Handbook" Second Edition, J. Brandrup et al. John Wiley & Sons, 1975. Editors at page III 139 to III 192, the teachings of which is incorporated herein by reference. These polymers include polyimides, polyamic acids, perfluorinated polymers, poly(dienes), poly(alkenes), poly(acrylics), poly(methacrylics), poly(vinyl ethers), poly(vinyl thioethers), poly(vinyl alcohol), poly(vinyl ketones), poly(vinyl halides), poly (vinyl nitriles), poly(vinyl esters), poly(styrenes), poly(phenylenes), poly(oxides), poly(carbonates), poly(esters), poly(anhydrides), poly(urethanes), poly(sulfonates), Nitroso-polymers, poly(siloxanes), poly(sulfides), poly(thioesters), poly(sulfones), poly(sulfonamides), poly(amides), poly(imines), poly(ureas), poly(phosphazenes), poly(silanes), poly(silazanes), poly(furan tetracarboxylic acid diimides), poly(benzoxazoles), poly(oxadiazoles), poly(benzothiazinophenothiazines), poly(benzothiazoles), poly(pyrazinoquinoxalines), poly(pyromellitimides), poly(quinoxalines), poly(benzimidazoles), poly(oxindoles), poly(oxoisoindolines), poly(dioxoisoindolines), poly(triazines), poly(pyridazines), poly(piperazines), poly(pyridines), poly(piperidenes), poly(triazoles), poly(pyrazoles), poly(pyrrolidines), poly(carboranes), poly(fluoresceins), poly(oxabicyclononanes), poly(dibenzofurans), poly(phthalides), poly(acetals) poly(anhydrides) and carbohydrates. The most preferred thermoplastic polymers are fluoropolymer materials, polyimide materials and polyimide precursors such as polyamic acids.

Generally, the polyimides include polymers having diamine and monoimide recurring units.

Generally, the polyimides having diamine units have the following recurring units:

where n is an integer representing the number of repeating units to provide a molecular weight usually about 10,000 to about 100,000. R is at least one tetravalent organic radical selected form the group consisting of:

$R_1$ being selected from the group consisting of divalent aliphatic hydrocarbon radicals having form 1 to 4 carbon atoms and carbonyl, oxy, sulfo, sulfide, ether, silxane, phosine oxide, hexafluoriosopropylidene and sulfonyl radicals and in which $R^1$ is at least one divalent radical selected from the group consisting of an aliphatic organic radical or from the group shown:

in which $R_3$ is divalent organic radical selected from the group consisting of $R_2$, silico and amino radicals. Polymers containing two or more of the R and/or $R_1$ radicals, especially multiple series of $R_1$ containing amino radicals, can be used.

Generally, the polyimides having monoimide units have the following recurring units where $R^4$ is trivalent and p is an integer representing the number of repeating units to provide a molecular weight usually about 10,000 to 100,000.

The Encyclopedia of Chemical Technology Third Edition article entitled, "Polyimides", Vol. 18, p. 704–719 Executive Editor, M. Grayson, John Wiley & Sons, 1982, the teaching of which is incorporated by reference, describes various polyimide materials including homopolymers and their polyamic acid precursors.

Fluoropolymers useful to practice this invention include polytetrafluoroethylene, perfluoroalkanes and fluorinated ethylene propylene. This list is exemplary only and not limiting.

Figure 5:
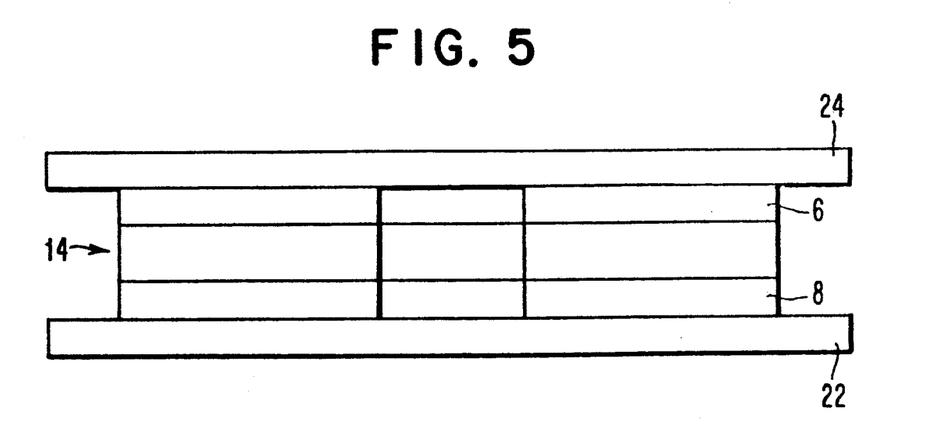
FIG. 5 diagrammatically shows the structure of FIG. 2 or FIG. 4 in an apparatus to provide pressure thereon.

In FIG. 5 the structure of FIG. 2 or FIG. 4 is shown held between platen 22 and platen 24. Conditions are provided to put material layer 6 and 8 in a state referred to in the art as a viscoelastic fluid or a rubbery fluid which shows network flow, plastic deformation, or plastic creep when pressure is applied thereto. If the material of 6 or 8 has a low degree of crystallinity, such as an amorphous material, it is in the viscoelastic state substantially at or above the glass transition temperature ($T_g$). Although the glass transition temperature of many materials is above room temperature, it can be at or below room temperature. If the ($T_g$) is below room temperature, the material may have to be cooled to achieve a desireable flow characteristic. If the material of 6 or 8 has a high degree of crystallinity, it is in the viscoelastic state substantially at or above the melting temperature ($T_m$). The material of layers 6 and 8 and substrate 10 can be a metal, a ceramic, a polymer, a glass, a semiconducting material, a semimetal and the like in an amorphous, semicrystalline or crystalline state.

In the most preferred embodiment the materials 6 and 8 are polymers having a $T_g$ above room temperature. The substrate 14 is heated to a glass transition temperature of materials 6 and 8. For polyimide type materials this temperature is generally in excess of about 125° C. The substrate 14 as shown in FIG. 5 is pressed between platens 22 and 24.

Figure 6:
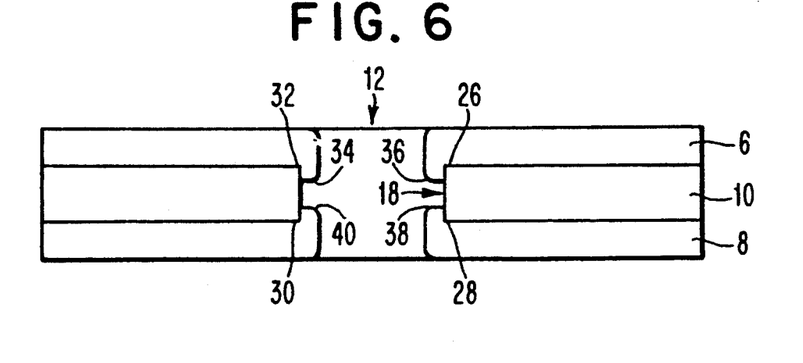
FIGS. 6, 7, 8, 9, 10 diagrammatically shows the result of the application of pressure.
Figure 7:
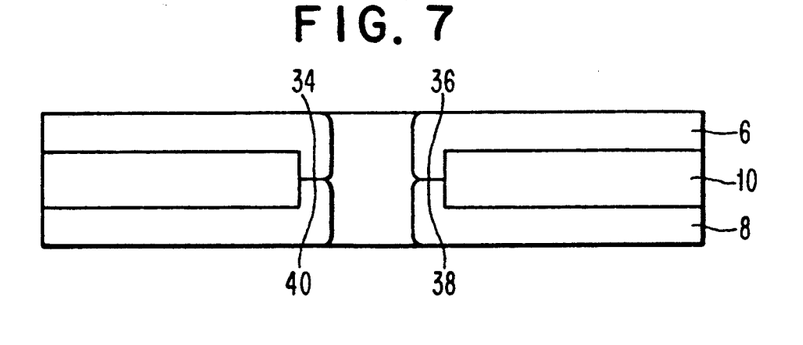
Figure 8:
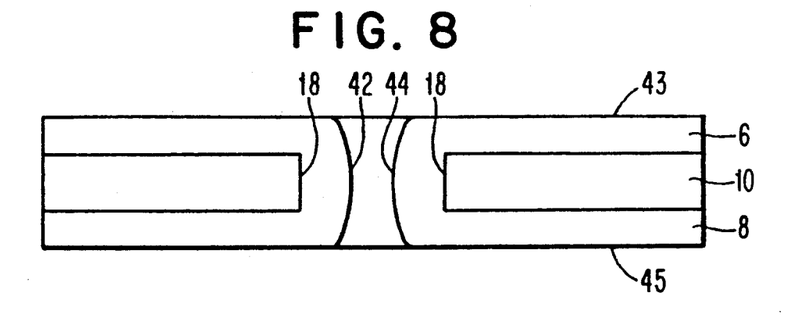
Figure 9:
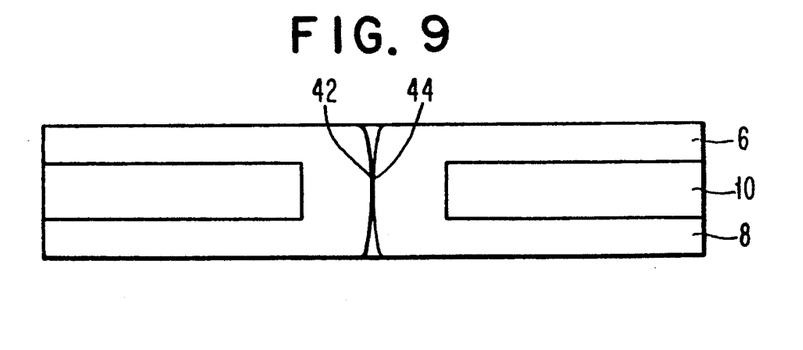
Figure 10:
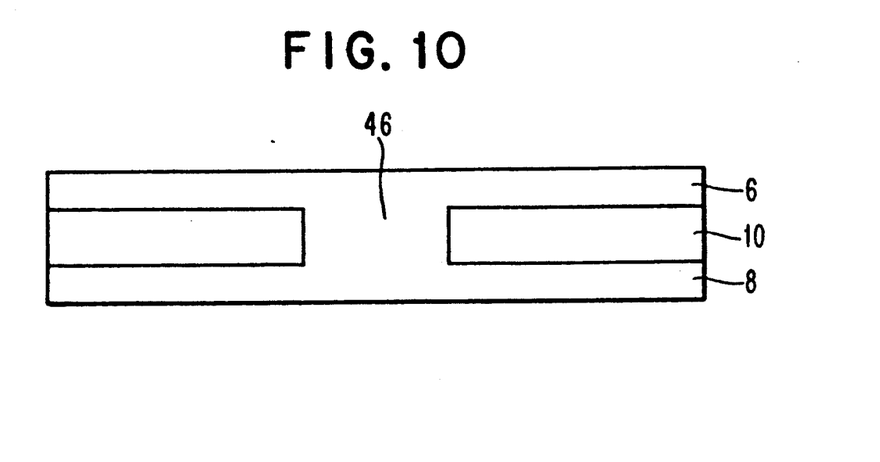

FIGS. 6 to 9 show the sequence of the flow of the material 6 and 8 as a function of time. In FIG. 6 the material 6 and 8 is shown just beginning to flow around the edges of 26, 28, 30 and 32 down the sidewall 18 of through-hole 12. As the length of time of the application of the pressure increases, the flowing material front 34, 36, 38 and 40 continue to progress along sidewall 18 until front 34 touches front 40 and front 36 touches front 38 as shown in FIG. 7. After the fronts meet, the thickness of the material coating sidewall 18 begins to thicken since polymer front 42 and 44, shown in FIG. 8, progress towards the center of through-hole 12 until front 42 and 44 touch as shown in FIG. 9. Thereafter as shown in FIG. 10, fronts 42 and 44 merged and through-hole 12 is completely filled with materials 6 and 8. Generally materials 6 and 8 will be the same material.

For the materials 6 and 8 to flow, as shown in FIGS. 6 to 9, and for material 84 to flow, as shown in FIGS. 13 to 16 which are described below, the material should wet the surface on which it flows. The material will wet the surface of the substrate if the surface free energy of the material is less than or equal to the surface free energy of the substrate surface. The material can also wet the surface of the substrate surface if there is a chemical interaction between the material and substrate such as a coulombic interaction, ionic bonding, covalent bonding, hydrogen bonding, dipole-dipole interactions, charge transfer complexation, mechanical interlocking, chain in entanglement and the like.

Figure 11:
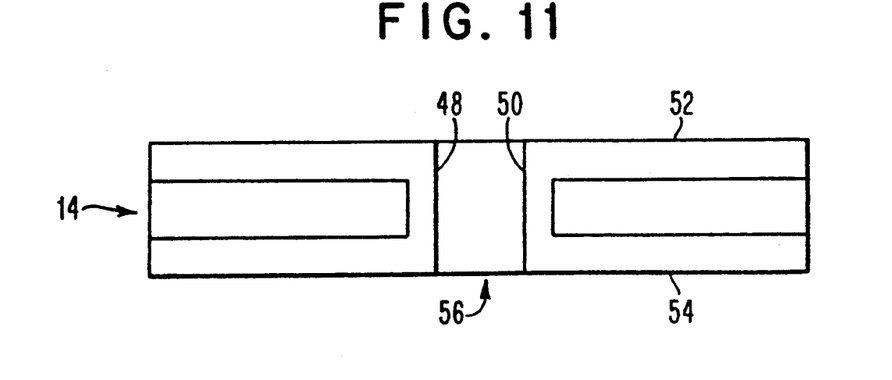
FIG. 11 shows the structure of FIG. 10 which has a through-hole completely filled with a material coating, having a through-hole formed in the material filling the through-hole.

After a through-hole 12 has been completely filled, as shown in FIG. 10, if it is desired, material 46 filling through-hole 12 can be partially removed as shown in FIG. 11 by punching, drilling or etching to provide a through-hole 56 through substrate 14.

The sidewalls 42 and 44 of the material 6 and 8 in the through-hole 12, as shown in FIG. 8, or the sidewalls 48 and 50 of the through-hole 56 as shown in FIG. 11 can be coated with an electrical conductor or the through-hole 12 or 56 can be completely filled with the electrical conductor to provide an electrically conducting via from surface 52 to surface 54 of FIG. 11 or from surface 43 to surface 45 of FIG. 8. The electrical conductors are typically metals.

A large number of through-holes can be filled or have the sidewalls coated with a material by the methods described herein. The through-hole can have a cross sectional dimension less than about 10 mils and preferably less than about 5 mils. The through-hole depth can be less than about 10 mils, preferably less than about 5 mils. Each through-hole can be spaced apart at a distance less than about twice the minimum cross section dimension.

Methods for metallizing the sidewalls of the through-holes 12 and 56 of FIG. 8 and FIG. 11 respectfully are found in copending U.S. patent application Ser. No. 07/339,334 filed on Apr. 17, 1989, commonly assigned, entitled "Multi-level Circuit Card Structures" to Bregman et al., the teaching of which is incorporated herein by reference.

As described in the Bregman et al. application, when the material 6 and 8 of FIG. 1 is a polyimide material, the entire polyimide surface is seeded with a suitable seed material for example, platinum, palladium, nickel and the like. The preferred seed material is palladium. U.S. patent application Ser. No. 290,486 filed on Dec. 23, 1988, commonly assigned, to Viehbeck et al. entitled "Method for Conditioning An Organic Polymeric Material" described electrochemical and chemical methods for seeding a polymeric material, in particular a polyimide material with a seed material such as palladium. The teaching therein is incorporated herein by reference. The process according to Viehbeck et al., is a method for conditioning at least one surface of an organic polymeric material that is capable of transporting electrons and counterions in a reversible manner. The process comprises applying electrons to redox sites, i.e., sites which can undergo reduction and oxidation, of the polymeric material with concurrent uptake of counterions from the electrolyte. The reduced polymeric material is then placed into contact with a solution that contains cations of a metal which will diffuse into the organic polymeric material and contact the redox sites thereof. The redox sites thereby transfer electrons to the cations that are energetically disposed to receiving electrons from the redox sites to thereby reduce the cation to metal atoms in the zero oxidation state. Metal deposited in such a manner can mediate continued electron transfer from the polymer, resulting in further metal deposition near the previously deposited metal. Next, a second metal is deposited from an electrolysis plating bath onto the zero oxidation state metal.

The electrons are supplied to the redox sites to the polymeric material by either means of a cathode in an electrochemical circuit, the potential applied to the cathode being equal to or negative of the reduction potential of the polymer or preferably by means of a reducing agent and solution, the oxidation potential of the reducing agent being negative with respect to the reduction potential of the polymer. Alternatively, the electrons can be supplied to the redox sites of the polymeric material by contacting the polymeric material with tetrakis (dimethylamino) ethylene. The reducing agent may be in a charged or neutral form. The polymer must possess chemical functionally whose reduction potential is negative relative to the reduction potential of the metal ions. A suitable reducing agent for conditioning the polymer surface is a benzophenone radical anion in acetonitrile containing tetrabutylammonium fluoroborate as electrolyte. This is exemplary only and not limiting. Other examples can be found in the Viehbeck et al. application. Other seeding techniques commonly known in the art can also be used.

By means commonly know in the art, another metal is electrolessly deposited onto the seed layer to form a plating base. Metals such as copper, gold, palladium, silver, nickel and the like can be electrolessly deposited onto the seed layer. The thickness of the electrolessly deposited metal is from about 0.05 micron to about 35 microns, preferably form about 0.1 micron to about 8 microns, most preferably from about 0.1 micron to about 2 microns.

Figure 12:
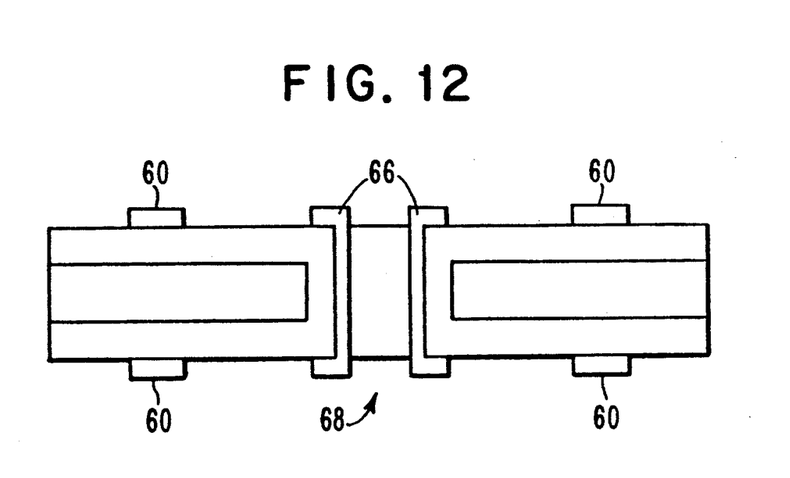
FIG. 12 shows the structure of FIG. 8 or FIG. 11 having a metalization pattern in the through-hole and on the surface of the coating substrate.

Following deposition of the plating base, a desired pattern can be fabricated by applying, exposing and developing a photoresist prior to electroplating by methods commonly known in the art, a metal, for example, copper, gold, silver, cobalt, nickel and the like onto the exposed electrolessly deposited plating base layer to plate up metal lines onto the exposed plating base. The plated up lines have a thickness from about 0.5 mils. to about 10 mils., preferably from about 0.5 mils to about 5 mils, most preferably from about 1 mil to about 3 mils. The plated up lines form electrical conductors 60 in FIG. 12, which are disposed on the surfaces 52 and 54 of dielectric material 6 and 8 respectively. Electroplated metal 66 also coats the plating base 66 which has been deposited on sidewall 48 and 50 of through-hole 56 or sidewall 42 and 44 of through-hole 12 to form electrically conductive via 68.

The excess plating photoresist is removed by means commonly known in the art. The excess plating base and seed material which is not beneath the electroplated conductor such as 60 and 66 is removed by methods commonly known in the art. Where the plating base is copper, the plating base can be removed by copper etchants such as, ammonium persulfate or ferric choloride. The excess seed material, for example, palladium is highly diffuse and need not be removed but can be removed with nitro acid, if so desired. There are exemplary only and not limiting.

Figure 13:
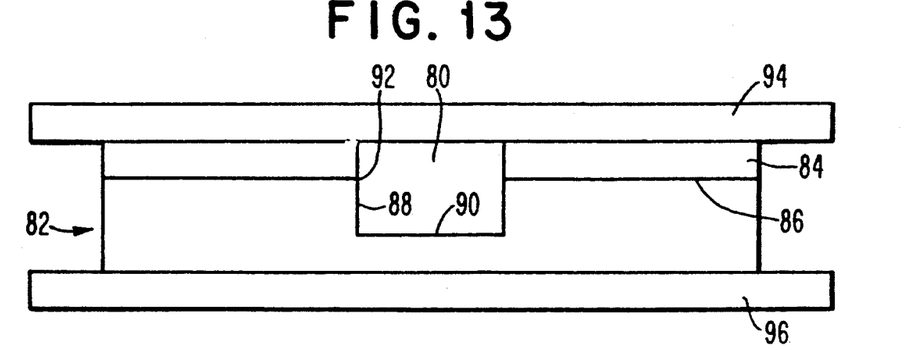
FIG. 13 shows a substrate with a material layer thereon wherein the substrate has a blind hole formed therein. The substrate is diagrammatically shown in an apparatus to apply pressure.

As shown in FIG. 13, substrate 82 and a cavity 80 extending to surface 86 of substrate 82 and extending through material layer 84 which is disposed on surface 86 of substrate 82. Material 84 can be pressed into blind hole 80 to coat the sidewall 88 and the bottom of blind hole 90 or to completely fill the blind hold 80. A blind hole as shown in FIG. 13 extends to one surface of substrate 82 but does not extend through the substrate 82 as do through-holes 12 of substrate 14 as shown in FIG. 2. Material layer 84 is held at a suitable temperature and pressure is applied to press it into blind-hole 80.

Figure 14:
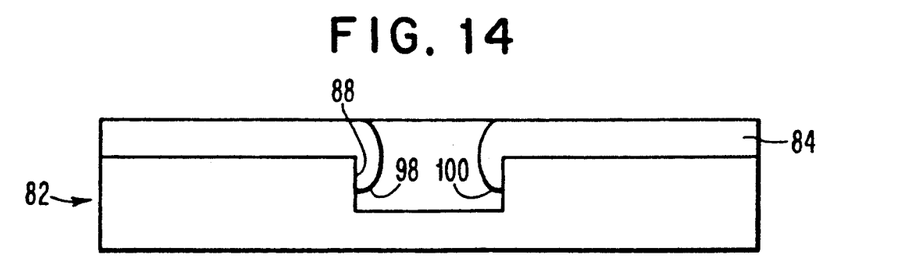
Figure 15:
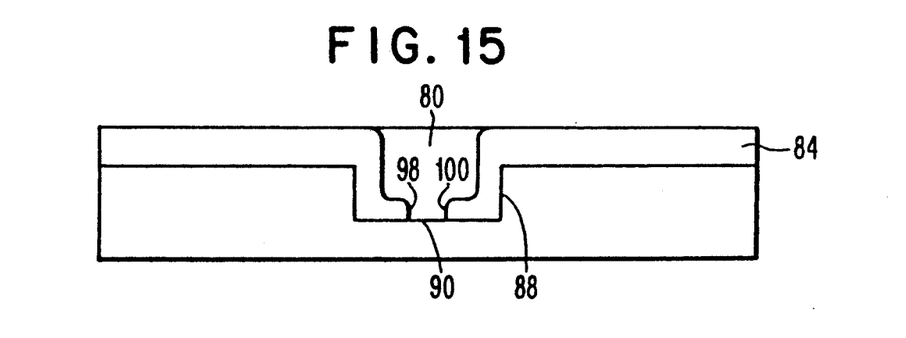

The time sequence of the flow of material 84 into blind hole 80 is similar to that shown for substrate 14 in FIGS. 6–10. A plastically flowing material 84 flows down edge 92 of blind hole 80 of substrate 82 and then onto bottom 90 of blind hole 80. As described with reference to FIG. 5 pressure is applied by pressing together platen 94 and platen 96. FIG. 14 shows flowing material 84 fronts 98 and 100 flowing down sidewall 88 of blind hole 80. FIG. 15 shows flowing front 98 and 100 of material 84 flowing along bottom 90 of blind hole 80. As the pressure is applied fronts 98 and 100 of material 84 flows along bottom 90 of blind hole 80 and on the continued application of pressure fronts 98 and 100 of material 84 are believed to flow along the bottom 90 of blind hole 80. On the continued application of pressure fronts 98 and 100 will merge and thereafter as the pressure is continued to be applied, blind hole 80 becomes completely filled as shown in FIG. 16.

EXAMPLES

EXAMPLE 1

DuPont Pyralin PI 2525, a thermoplastic polyimide, was dip coated onto a 0.003 inch copper foil. Approximately 0.0005 inch polymer thickness results from each dip. Multiple dips were used to achieve a 0.001 inch and a 0.002 inch final polymer thickness on both sides of the copper foil. Both samples were baked at 200° C. for 5 minutes between each dip coat and after the last coating is complete. Through-holes, having a diameter of 0.005 inches, were mechanically punched through each sample. These exposed the copper core inside the through-hole. The copper core was etched back by dipping the sample for 4 minutes in ferric chloride at 50° C. The samples were then copiously rinsed with the de-ionized water and the dried. The samples were heated about $T_g$ 310° C. and pressed between two platens. For samples with the 0.001 inch polymer thickness 5,000 psi at 350° C. for 15 seconds was used. For samples with 0.002 inch polymer thickness 5,000 psi at 340° C. for 10 seconds was used.

Figure 17:
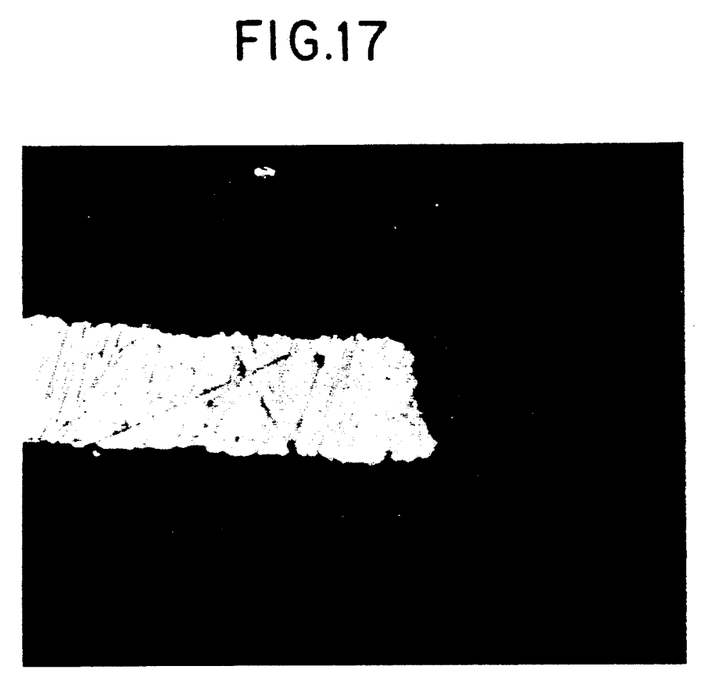
FIG. 17 is a scanning electron micrograph of a structure shown in FIG. 8.

FIG. 17 shows a cross section of a sample that has been potted in epoxy. The bright copper core can clearly be seen surrounded by PI 2525, all embedded in an epoxy matrix to facilitate cross sectioning. This is a representative scanning electron micrograph of the 0.001 inch polymer/0.003 inch copper 0.001 inch polymer isolated through-hole structure.

EXAMPLE 2

Figure 18:
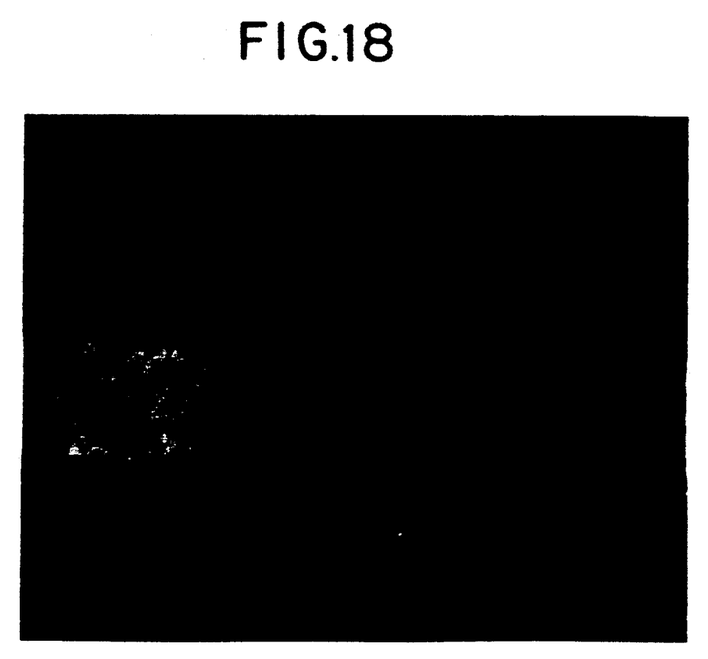
FIG. 18 is a scanning electron micrograph of a structure shown in FIG. 10.

Dip coat polyamic acid 5811D, manufactured by DuPont which is a BPDA-PDA polyimide precursor onto one ounce prepunched, copper-invar-copper core. The core has a sputtered chromium surface. The coated core is baked at 85° C. for one hour. The core is then pressed at 750 PSI at 125° C. for 45 minutes and then pressed at 750 PSI at 250° C. for one hour to fill the punched holes with the polymer. FIG. 18 shows a scanning electron micro graph of a cross section of one sample potted in epoxy.

EXAMPLE 3

A free standing amic acid layer can be fabricated and then laminated to the substrate. Polyamic acid films can be made by coating the polyamic acid solution which contains the polyamic acid and a solvent, e.g. NMP, on an appropriate substrate, e.g., glass. The polyamic acid can be spin coated on the substrate or by other commonly used methods. The substrates are prebaked to remove the solvent at a temperature which prevents any appreciable imidization of the polyamic acid occuring. The coating is removed from the substrate and laminated onto the work piece, for example a metal substrate.

Spin coat polyamic acid (BPDA-PDA) at 1000 rpm for 60 s onto two (2) 6×6×⅛ inch glass plates. Bake the coated glass plates at 80° C. for 30 minutes. The film is then easily removed from the substrate.

The polyamic acid films are placed on the substrate of interest. Cavities are formed in the substrate and it is heated and pressed as described in Examples 1 and 2. Successful lamination which provided good substrate adhesion and via insulating characteristics were obtained using the following conditions.

80° C./1300psi/for 20 minutes 90° C./1300psi/for 20 minutes 100° C./1300psi/for 20 minutes.

Once lamination is complete, final cure to convert the polyamic acid to the polyimide can occure. For instance, 100° C./for 60 minutes 200° C./for 60 minutes 400° C./for 60 minutes under $N_2$.

While the invention has been illustrated and described with respect to preferred embodiments it is to be understood that the invention is not limited to the precise construction herein disclosed, and the rights are reserved to all changes and modifications coming within the scope of the invention as defined in the appended claims.

Having thus described our invention, what we claim as new and desire to secure as Letters Patent is;

1. A method comprising:
   providing a substrate having a substantially solvent free material layer on at least a part of a surface of said substrate, there being a cavity having a sidewall in said substrate extending at least to said layer;
   providing an environment sufficient for said material layer to flow;
   pressing said material towards said substrate causing said material layer to flow into said cavity; and
   said material layer first flows down said sidewall forming a coating which substantially coats said sidewall, on continued pressing of said material layer said coating thickens; and
   controlling said pressing to control the thickness of said coating to be less than sufficient to completely fill said cavity.

2. The method of claim 1, wherein said step of providing an environment sufficient for said material layer to flow is heating said material layer.

3. The method of claim 2, wherein said material layer is heated to at least the glass transition temperature of said material.

4. The method of claim 2, wherein said material layer is heated to at least the melting temperature of said material.

5. The method of claim 1, wherein said material which flows into said cavity wets said substrate.

6. The method of claim 1, wherein said material which flows into said cavity has a lower surface free energy than the surface free energy of said substrate.

7. The method of claim 1, wherein said cavity extends through said substrate.

8. The method of claim 1, wherein one end of said cavity extends through the surface of said substrate and the other end of said cavity terminates within said substrate.

9. The method of claim 7, wherein said substrate has a first and second major surface and wherein said material layer is disposed on said first and said second major surface and wherein said cavity extends from said first and second major surface through said material layer on said first and second major surfaces.

10. The method of claim 1, wherein said material layer is pressed to coat said cavity sidewall.

11. The method of claim 8, wherein said material layer is pressed to coat said cavity sidewall and said cavity bottom.

12. The method of claim 1, wherein said cavity has a cross sectional dimension less than about 10 mils and a depth of less than about 10 mils, wherein there are a plurality of said cavities each of which is spaced from an adjacent cavity at a distance less than about twice said minimum cross sectional dimension.

13. The method of claim 1, wherein said substrate is a conductor.

14. The method of claim 13, wherein said conductor is selected form the group consisting of Al, Cu, Mo and Cu-Invar-Cu.

15. The method of claim 1, wherein said material layer is a polymeric material.

16. The method of claim 15, wherein said polymeric material is a thermoplastic polymeric material.

17. The method of claim 15, wherein said polymeric material is selected from the group consisting of polyimide materials, fluorinated polymeric materials and polyamic acid materials.

18. The method of claim 1, wherein said material layer is pressed towards said substrate by placing said substrate with said material layer thereon between a first and second platen which are pressed towards each other.

19. The method of claim 1, wherein said pressed material layer has a substantially planar surface.

20. The method of claim 1, wherein said cavity is formed by a method selected from the group consisting of punching, drilling, laser ablation and etching.

21. The method of claim 1, further including after forming said cavity, removing a predetermined amount of said substrate along the sidewall of said cavity leaving a predetermined amount of said material layer overhanging said cavity.

22. The method of claim 1, wherein said material is selected from the group of polyimides, polyamic acids, perfluorinated polymers, poly(dienes), poly(alkenes), poly(acrylics), poly(methacrylics), poly(vinyl ethers), poly(vinyl thioethers), poly(vinyl alcohol), poly(vinyl ketones), poly(vinyl halides), poly (vinyl nitriles), poly(vinyl esters), poly(styrenes), poly(phenylenes), poly(oxides), poly(carbonates), poly(esters), poly(anhydrides), poly(urethanes), poly(sulfonates), Nitroso-polymers, poly(siloxanes), poly(sulfides), poly(thioesters), poly(sulfones), poly(sulfonamides), poly(amides), poly(imines), poly(ureas), poly(phosphazenes), poly(silanes), poly(silazanes), poly(furan tetracarboxylic acid diimides), poly(benzoxazoles), poly(oxadiazoles), poly(benzothiazinophenothiazines), poly(benzothiazoles), poly(pyrazinoquinoxalines), poly(pyromellitimides), poly(quinoxalines), poly(benzimidazoles), poly(oxindoles), poly(oxoisoindolines), poly(dioxoisoindolines), poly(triazines), poly(pyridazines), poly(piperazines), poly(pyridines), poly(piperidenes), poly(triazoles), poly(pyrazoles), poly(pyrrolidines), poly(carboranes), poly(fluoresceins), poly(oxabicyclononanes), poly(dibenzofurans), poly(phthalides), poly(acetals) poly(anhydrides) and carbohydrates.

23. The method of claim 1, wherein said an electrical conductor is provided in said cavity.

24. The method of claim 1, wherein said step of providing an environment sufficient for said material layer to flow is cooling said material layer.

25. A method comprising:
providing a substrate having a substantially solvent free material layer on at least a part of a surface of said substrate, there being a cavity having a sidewall in said substrate extending at least to said layer;
providing an environment sufficient for said material layer to flow;
pressing said material towards said substrate causing said material layer to flow into said cavity;
said material layer first flows down said sidewall forming a coating which substantially coats said sidewall unit until said material reaches an obstruction in said cavity, on continued pressing of said material layer, said coating thickens; and
controlling said pressing to control the thickness of said coating to be less than sufficient to completely fill said cavity.

26. The method of claim 25, wherein said obstruction is a bottom of said cavity.

27. The method of claim 25, wherein said obstruction is said material layer flowing along said sidewall from the opposite direction.

28. A method comprising:
providing a substrate having a substantially solvent free material layer on at least a part of a surface of said substrate, there being a cavity having a sidewall in said substrate extending at least to said layer;
providing an environment sufficient for said material layer to be in a viscoelastic state permitting it to flow;
pressing said material towards said substrate causing said material layer to flow into said cavity;
said material layer first flows down said sidewall forming a coating which substantially coats said sidewall, on continued pressing of said material layer said coating thickens; and
controlling said pressing to control the thickness of said coating to be less than sufficient to completely fill said cavity.

29. A method comprising:
providing a substrate having a substantially solvent free material layer on at least a part of a surface of said substrate, there being a cavity having a sidewall in said substrate extending at least to said layer;
providing an environment sufficient for said material layer to be in a viscoelastic state permitting it to flow;
pressing said material towards said substrate causing said material layer to flow into said cavity;

said material layer first flows down said sidewall forming a coating which substantially coats said sidewall until said material layer reaches an obstruction in said cavity, on continued pressing of said material layer, said coating thickens; and controlling said pressing to control the thickness of said coating to be less than sufficient to completely fill said cavity.

* * * * *